(12) United States Patent
Hahn et al.

(10) Patent No.: US 10,223,199 B2
(45) Date of Patent: Mar. 5, 2019

(54) NON-VOLATILE MEMORY CONFIGURED TO RETURN ERROR REDUCED READ DATA

(71) Applicant: SANDISK TECHNOLOGIES LLC, Plano, TX (US)

(72) Inventors: Judah Gamliel Hahn, Ofra (IL); Gadi Vishne, Petach Tikva (IL); Joshua Lehmann, Modiin (IL); Alexander Bazarsky, Holon (IL); Ariel Navon, Revava (IL)

(73) Assignee: SanDisk Technologies LLC, Addison, TX (US)

(*) Notice: Subject to any disclaimer, the term of this patent is extended or adjusted under 35 U.S.C. 154(b) by 128 days.

(21) Appl. No.: 15/274,037

(22) Filed: Sep. 23, 2016

(65) Prior Publication Data
US 2018/0089024 A1    Mar. 29, 2018

(51) Int. Cl.
*G11C 11/10* (2006.01)
*G11C 16/10* (2006.01)
(Continued)

(52) U.S. Cl.
CPC .......... *G06F 11/1068* (2013.01); *G06F 3/064* (2013.01); *G06F 3/0619* (2013.01); *G06F 3/0679* (2013.01); *G11C 11/5628* (2013.01); *G11C 11/5642* (2013.01); *G11C 16/10* (2013.01); *G11C 16/26* (2013.01); *H04L 1/0017* (2013.01); *G11C 16/0483* (2013.01); *G11C 16/30* (2013.01); *G11C 16/32* (2013.01); *G11C 29/021* (2013.01); *G11C 29/028* (2013.01); *G11C 2029/0409* (2013.01); *H04L 1/004* (2013.01); *H04L 1/0015* (2013.01); *H04L 1/0025* (2013.01); *H04L 1/0026* (2013.01); *H04L 29/06523* (2013.01); *H04L 41/5022* (2013.01); *H04L 41/5025* (2013.01)

(58) Field of Classification Search
CPC ........... H04L 29/06523; H04L 41/5022; H04L 41/5025; H04L 1/0001; H04L 1/0015; H04L 1/0017; H04L 1/0025; H04L 1/0026; H04L 1/004; G06F 11/1012; G06F 11/1044; G06F 11/1048; G06F 11/1068; G06F 3/0619; G06F 3/064; G06F 3/0679; G11C 16/10; G11C 16/26; G11C 29/52
See application file for complete search history.

(56) References Cited

U.S. PATENT DOCUMENTS 7,254,765 B2   8/2007   Meyer
7,266,750 B1   9/2007   Patapoutian
(Continued)

OTHER PUBLICATIONS

Chaturvedi, et al., "Non-Volatile Storage System With Host Side Command Injection," filed Mar. 6, 2018.
(Continued)

*Primary Examiner* — Christian M Dorman
(74) *Attorney, Agent, or Firm* — Vierra Magen Marcus LLP

(57) ABSTRACT

A non-volatile memory system receives a request to read data. That request includes a quality of service indication. The memory system performs a read process that satisfies the quality of service indication and identifies a set of data with errors. The memory system returns the set of data with errors in response to the request.

17 Claims, 14 Drawing Sheets

(51) Int. Cl.

| | |
|---|---|
| *G11C 16/26* | (2006.01) |
| *G11C 29/52* | (2006.01) |
| *G06F 3/06* | (2006.01) |
| *G06F 11/10* | (2006.01) |
| *H04L 1/00* | (2006.01) |
| *G11C 11/56* | (2006.01) |
| *H04L 12/24* | (2006.01) |
| *H04L 29/06* | (2006.01) |
| *G11C 16/04* | (2006.01) |
| *G11C 16/30* | (2006.01) |
| *G11C 16/32* | (2006.01) |
| *G11C 29/02* | (2006.01) |
| *G11C 29/04* | (2006.01) |

(56) References Cited

U.S. PATENT DOCUMENTS

| | | |
|---|---|---|
| 7,849,383 B2 | 12/2010 | Lin |
| 8,301,979 B2 | 10/2012 | Sharon |
| 8,479,077 B2 | 7/2013 | Lee |
| 9,201,777 B2 | 12/2015 | Hsu |
| 2004/0190523 A1* | 9/2004 | Gessner ............... H04L 1/0001 370/395.4 |
| 2008/0244338 A1 | 10/2008 | Mokhlesi |
| 2008/0250300 A1 | 10/2008 | Mokhlesi |
| 2008/0276156 A1 | 11/2008 | Gunnam |
| 2008/0301521 A1 | 12/2008 | Gunnam |
| 2009/0106626 A1 | 4/2009 | Hou |
| 2013/0151755 A1* | 6/2013 | Elhamias ............ G06F 12/0246 711/103 |
| 2014/0105036 A1* | 4/2014 | Anschutz ............ H04L 41/5019 370/252 |
| 2014/0181428 A1* | 6/2014 | Hsu ..................... G06F 12/00 711/154 |
| 2014/0229658 A1* | 8/2014 | Maharana ........... G06F 12/0866 711/103 |
| 2015/0195374 A1 | 7/2015 | Wang |
| 2015/0254129 A1* | 9/2015 | Authement ......... G06F 11/1048 714/704 |
| 2015/0340099 A1* | 11/2015 | Kwak ................... G11C 16/34 711/103 |
| 2016/0004438 A1* | 1/2016 | Moon ..................... G06F 3/061 711/103 |
| 2016/0026406 A1 | 1/2016 | Hahn |
| 2016/0070486 A1 | 3/2016 | Anderson |
| 2016/0246726 A1 | 8/2016 | Hahn |
| 2017/0031845 A1* | 2/2017 | Tzafrir ................ G06F 13/1668 |
| 2017/0242606 A1 | 8/2017 | Vlaiko |
| 2017/0242820 A1 | 8/2017 | Pupanagunta |

OTHER PUBLICATIONS

Strass, "An Introduction to NVMe," Seagate Technology LLC, 2016.

Native Command Queuing (NCQ) defined, Sandisk Global Customer Care, 2018 Western Digital Corporation, available at https://kb.sandisk.com/app/answers/detail/a_id/8146/~native-command.

NVM Express, Revision 1.3, May 1, 2017, available at http://nvmexpress.org.

NVM Express Introduction and History, NVM Express, Inc., Jul. 2017.

Huffman, "NVM Express: Optimized Interface for PCI Express* SSDs," Intel Corporation 2013.

PCIe SSD 101, An Overview of Standards, Markets and Performance, Storage Networking Industry Association, SNIA Solid State Storage Initiative, Aug. 2013.

"The Synopsys NVMe VIP: A High Level View," VIP Central, Sep. 17, 2015, available at https://blogs.synopsys.com/vip-central/2015/09/17/the-synopsys-nvme-vip-a-high-level-view/.

NVM Express, Revision 1.2.1, Jun. 5, 2016, available at http://nvmexpress.org.

Brewer, et al., "Disks for Data Centers, White paper for Fast 2016," Feb. 23, 2016 available at http://research.google.com/pubs/pub44830.html.

* cited by examiner

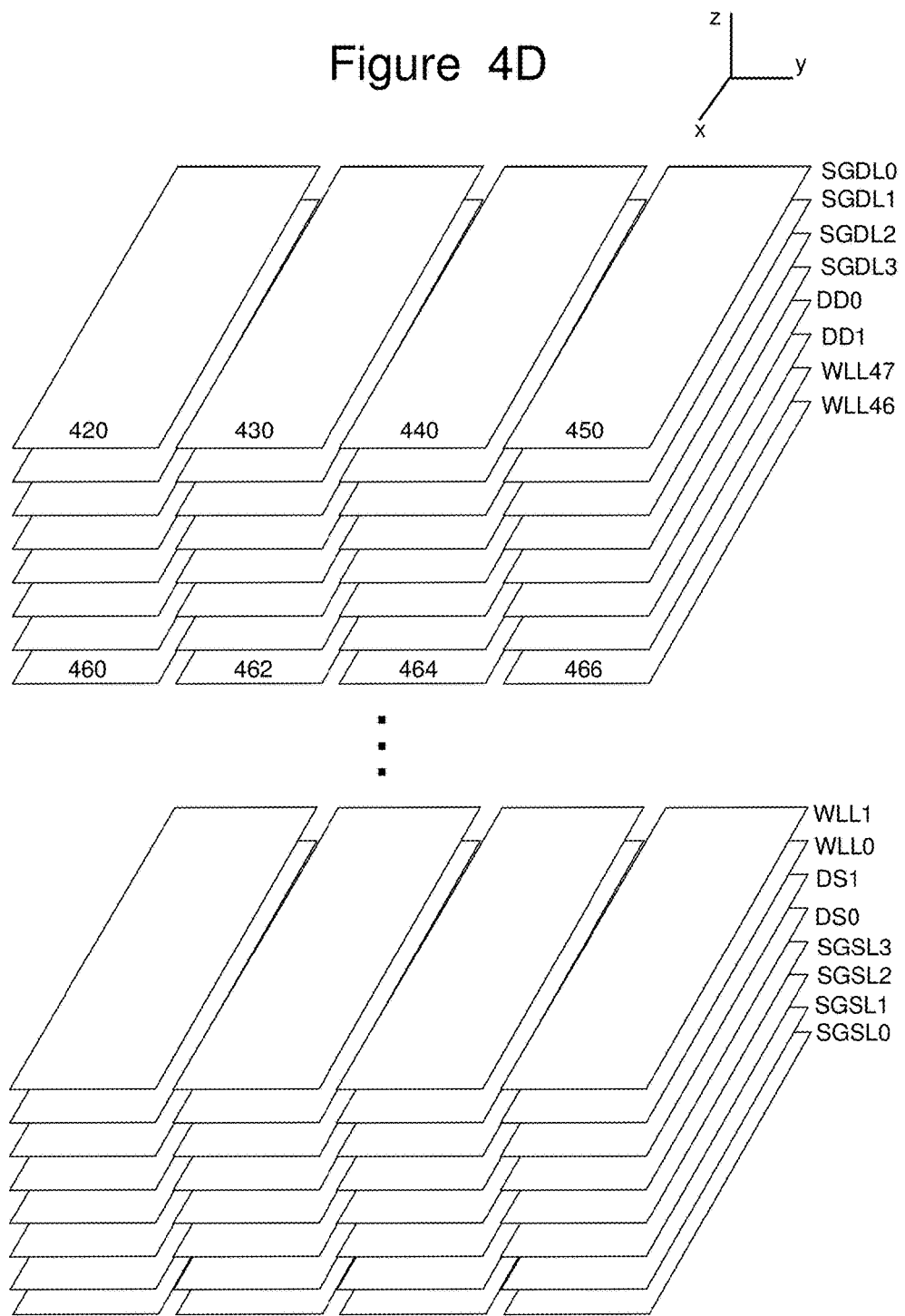

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

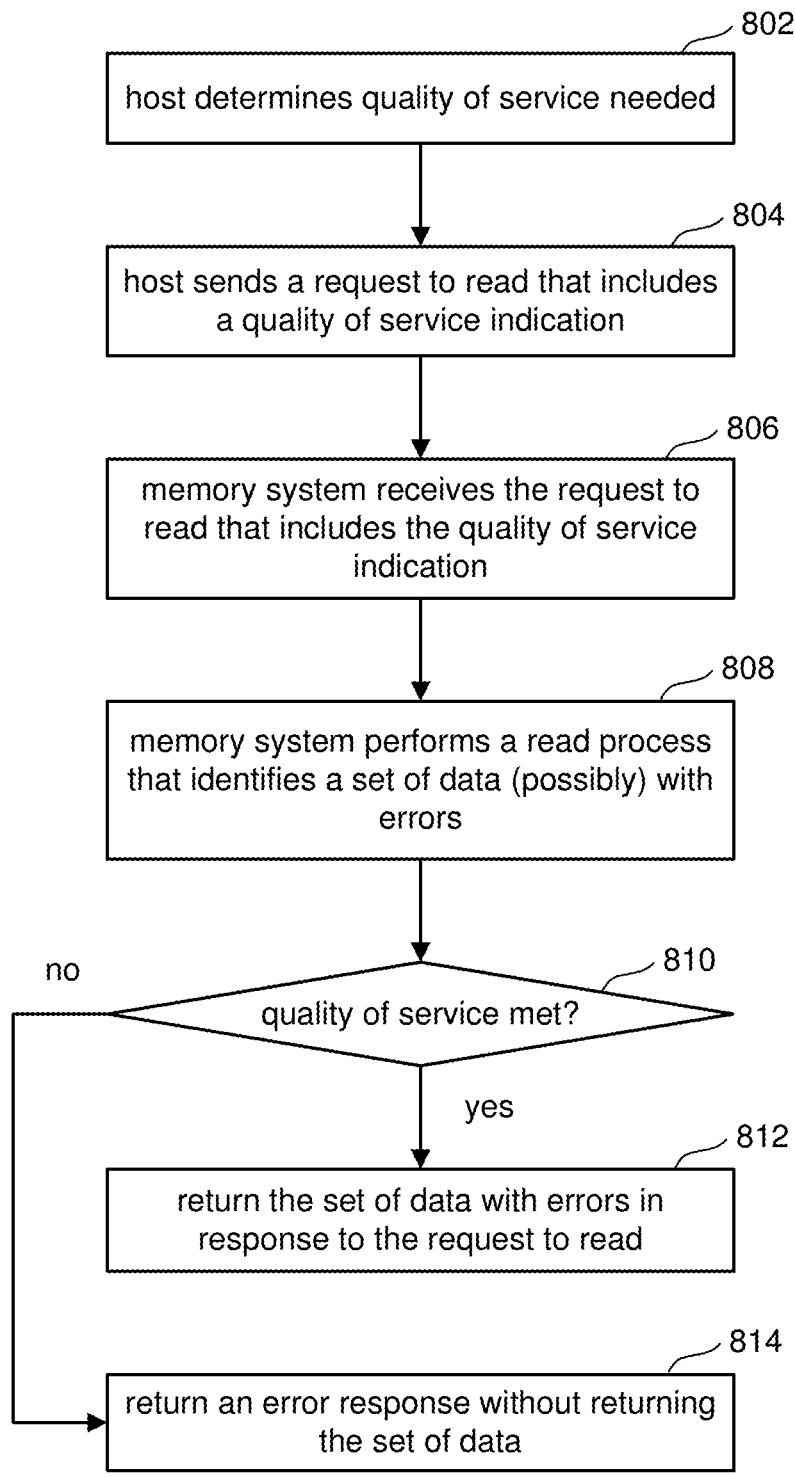

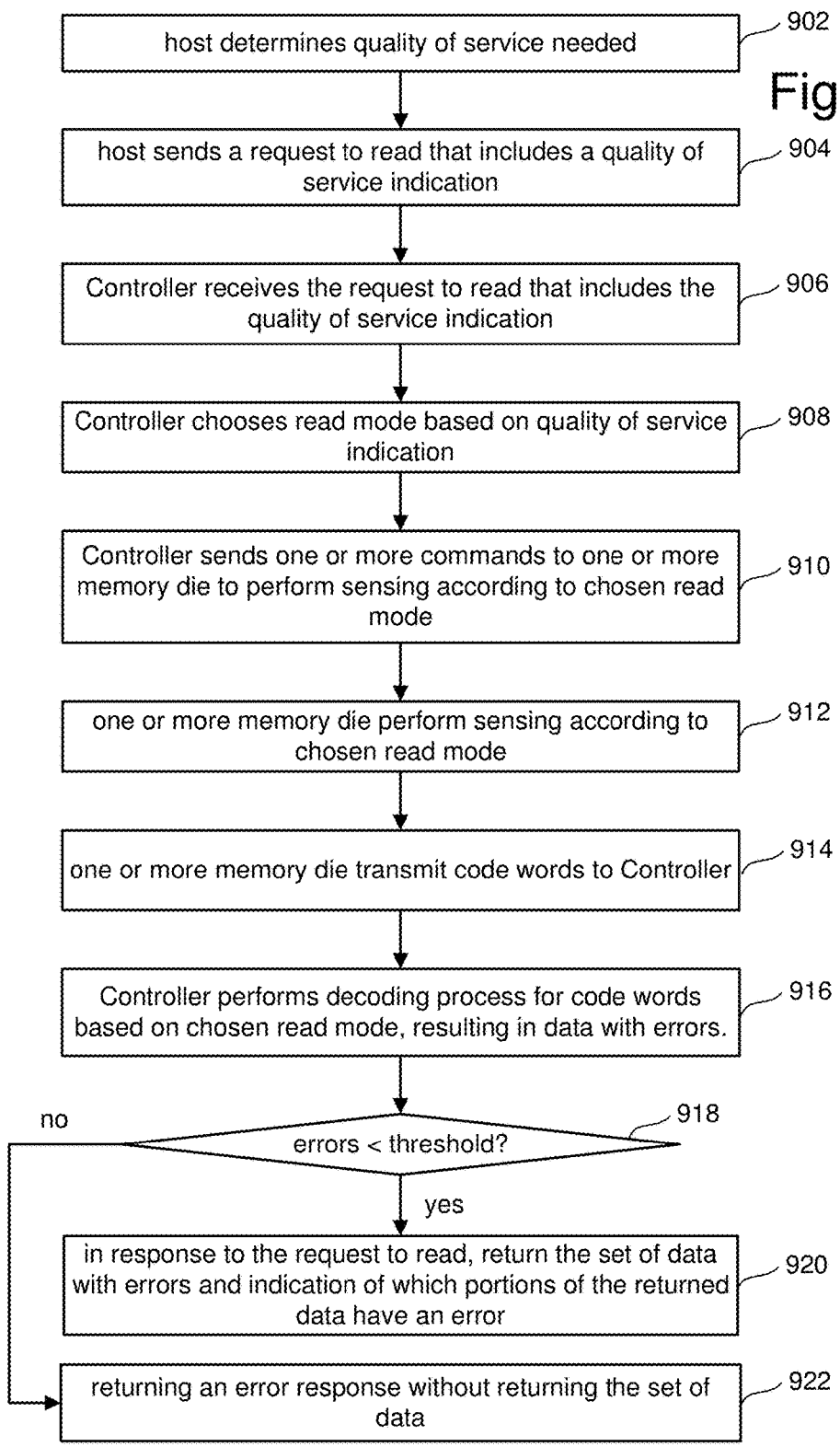

NON-VOLATILE MEMORY CONFIGURED TO RETURN ERROR REDUCED READ DATA

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (the host), the memory system can be used to program data, read data and/or erase data. It is important that once data is stored in a memory system, the data can be read back. Therefore, some memory systems will encode the data prior to programming using an error correction scheme. Subsequently, when reading the data, the memory system will decode the data and (hopefully) correct any errors found. If the number of errors is within the capabilities of the error correction scheme, then the memory system will decode the data and return the data error free to the host. If the number of errors is beyond the capabilities of the error correction scheme, then the memory system will report an error message to the host without returning any data to the host.

BRIEF DESCRIPTION OF THE DRAWINGS

Like-numbered elements refer to common components in the different figures.

FIG. 4D depicts a view of the select gate layers and word line layers.

FIG. 8 is a flow chart describing one embodiment of a process for reading data.

FIG. 9 is a flow chart describing one embodiment of a process for reading data.

DETAILED DESCRIPTION

There are some applications that do not require 100% error free data. For example, with photographs, video streaming and audio streaming, a small number of errors may be tolerated and even preferred as compared to completely failing to provide the data. Therefore, it is proposed to provide a non-volatile memory system that can be configured to return data that is "error reduced" rather than "error free" for applications that do not necessarily need error free data. A non-volatile storage system can be configured according to a quality of service indication (e.g., performance metric) which is not limited to only full success/failure decoding, but rather allows the storage system to return a partially decoded data. The memory system can be configured to implement a plurality of read modes that are characterized by different metrics of objective performance targets—such as a limited time period for decoding, a limit on power consumption, or a particular error-rate requirement (which is not limited to zero-erroneous bits).

One embodiment of a non-volatile storage apparatus that implements the proposed technology comprises a plurality of non-volatile memory cells and one or more control circuits in communication with the memory cells. The one or more control circuits are configured to receive a request to read that includes a quality of service indication. A read process is performed that identifies a set of data. That set of data includes one or more errors. The one or more control circuits are configured to return the set of data with the errors in response to the request to read if the quality of service indication is satisfied.

Figure 1:
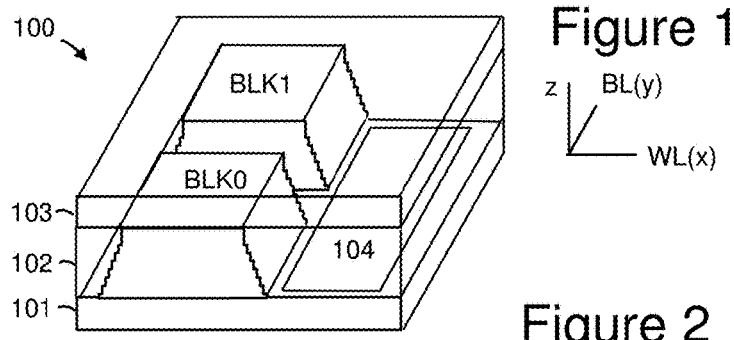
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions. In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
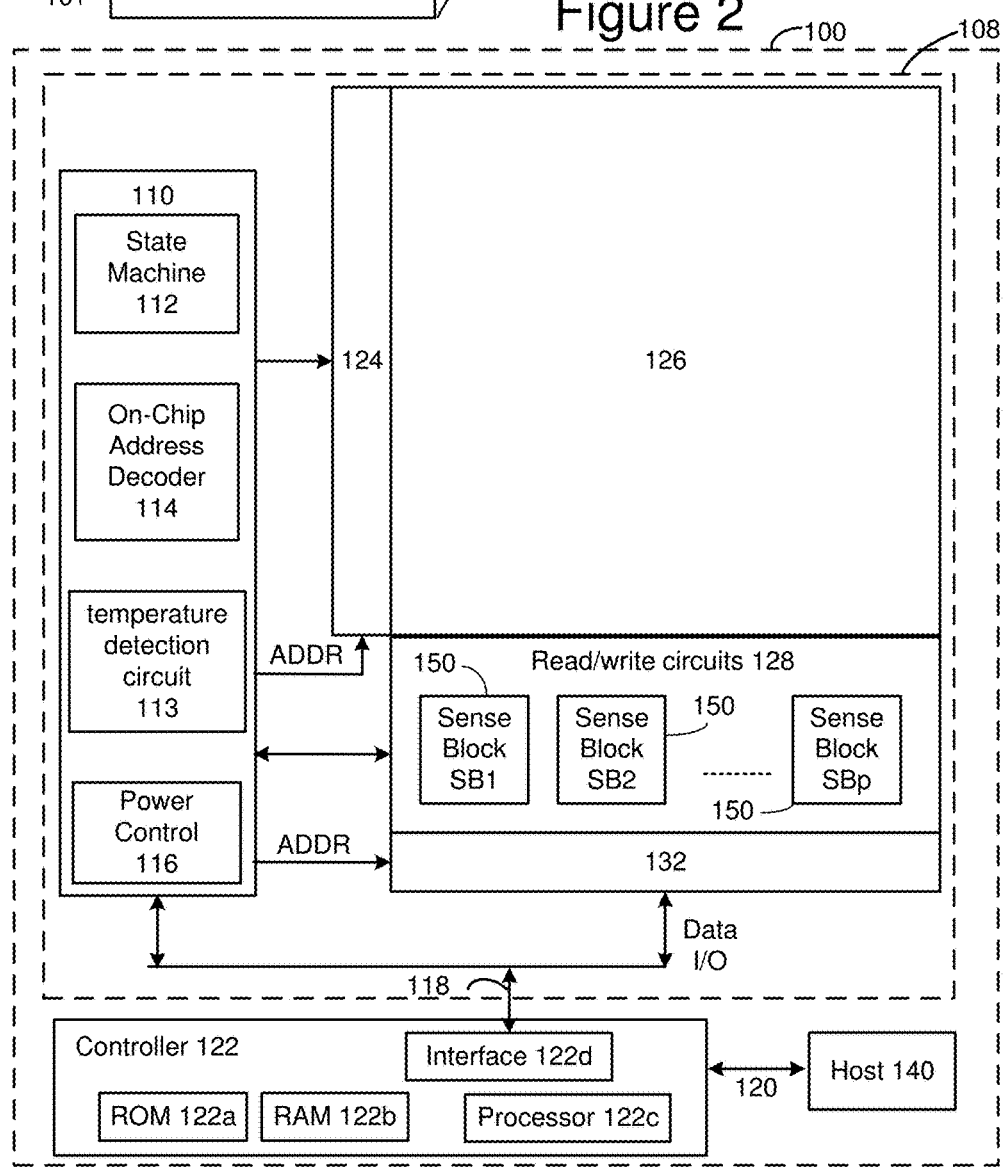
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a three dimensional monolithic array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die 108. In some embodiments, one Controller 122 will communicate with multiple memory die 108. In other embodiments, each memory die 108 has its own Controller. Commands and data are transferred between a host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations. Temperature detection circuit 113 (which is on memory die 108) is configured to detect temperature at the memory structure 126, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein. The one or more control circuits can include hardware only or a combination of hardware and software (including firmware). For example, a Controller programmed by firmware to perform the functions described herein is one example of a control circuit The (on-chip or off-chip) Controller 122 (which in one embodiment is an electrical circuit) may comprise one or more processors 122c, ROM 122a, RAM 122b and a Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between Controller 122 and one or more memory die 108. For example, memory interface 122d can change the format or timing of signals, provide a buffer, isolate from surges, latch I/O, etc. One or more processors 122c can issue commands to control circuitry 110 (or any other component of memory die 108) via Memory Interface 122d. In one embodiment, one or more processors 122c can access code from ROM 122a or RAM 122b to receive a request to read from the host that includes an operation limitation, perform a read process on the memory die 108 within the operation limitation and return data to the host from the read process that includes errors in response to the request to read.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

In one set of embodiments, a three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
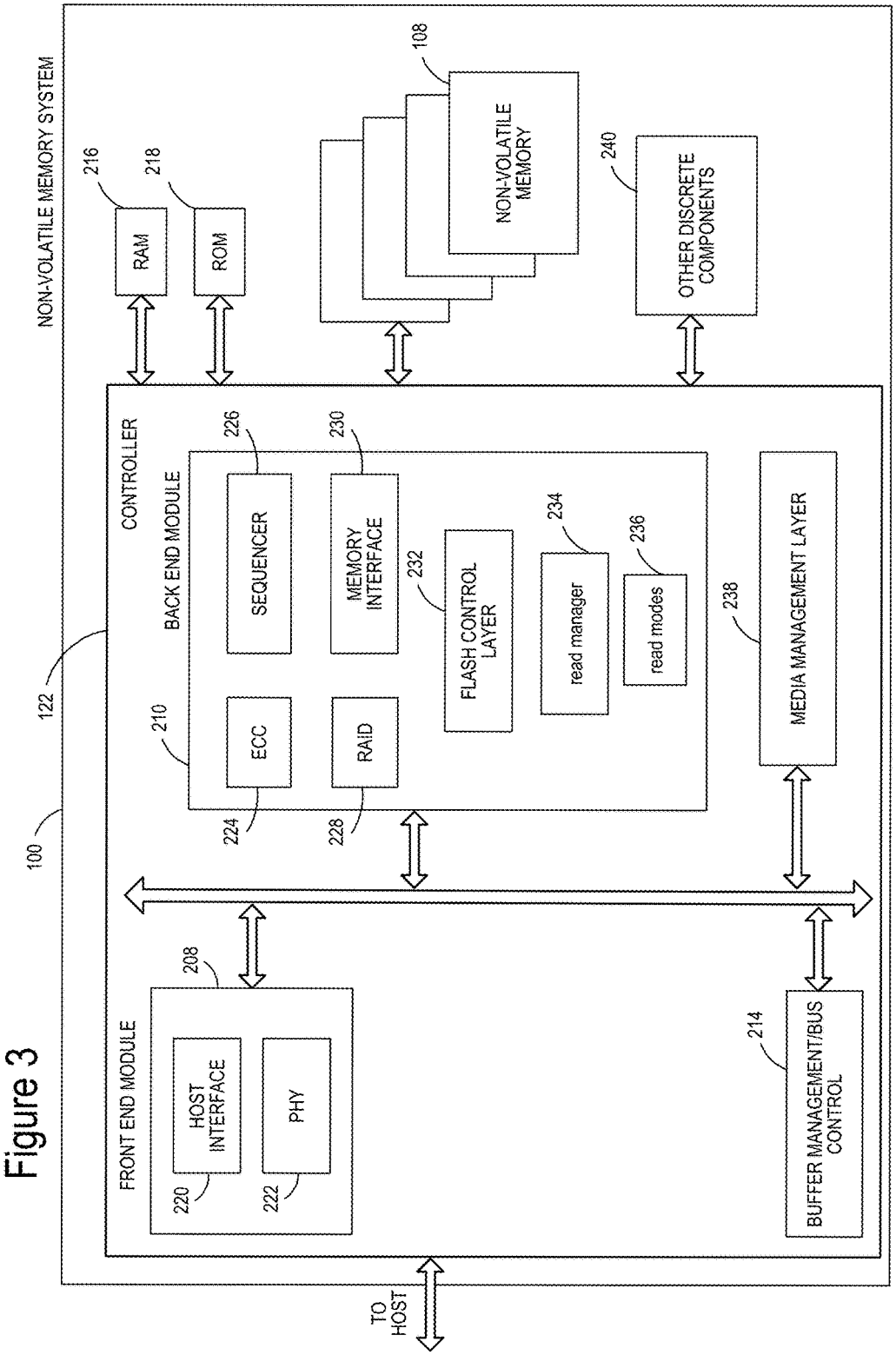
FIG. 3 is a block diagram depicting one embodiment of a Controller.

FIG. 3 is a block diagram of example memory system 100, depicting more details of one example implementation of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can manage the read and programming processes, format the flash memory to ensure the memory is operating properly, map out bad flash memory cells, and allocate spare memory cells to be substituted for future failed cells. Some part of the spare memory cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable memory interface, such as Toggle Mode 200, 400, or 800. In one embodiment, memory system 100 may be a card based system, such as a secure digital (SD) or a micro secure digital (micro-SD) card that can be in or connected to cellular telephones, computers, servers, smart appliances, digital cameras, etc. In an alternate embodiment, memory system 100 may be part of an embedded memory system. In another example, the memory system may be in the form of a solid state disk (SSD) drive (having one or, more memory die 108) installed in or connected to a personal computer or server. Thus, examples of hosts are cellular telephones, computers, servers, smart appliances, digital cameras, etc.

In some embodiments, non-volatile memory system 100 includes a single channel between Controller 122 and non-volatile memory die 108, however, the subject matter described herein is not limited to having a single memory channel. For example, in some memory system architectures, 2, 4, 8 or more channels may exist between the Controller and a memory die, depending on Controller capabilities. In any of the embodiments described herein, more than a single channel may exist between the Controller and the memory die, even if a single channel is shown in the drawings.

As depicted in FIG. 3, Controller 126 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function or related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor or circuit for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus control 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 (electrical circuit, software or combination of circuit and software) that encodes the data bytes received from the host, and decodes and error corrects the data bytes read from the non-volatile memory. A command sequencer 226 generates command sequences, such as program/read/erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a read manager 234 that manages the read process and read modes module 236. Read Manager 234 includes the logic (circuit) and/or code (software or firmware) for choosing, implementing and managing different read modes. For example, and as described below with respect to FIGS. 8 and 9, read manager 234 manages the process for receiving a request to read that includes an operation limitation (which can be a quality of service indication or some other limitation on the operation of the system such as as a limitation on power, voltage levels, timing, etc), performing a read process on the one or more memory die within the operation limitation and returning data from the read process that includes errors in response to the request to read. Read modes module 234 includes the logic and/or code for implementing a different read modes, as described below, in order to satisfy the operation limitation. In one example, the different read modes include different ECC read modes to be implemented by ECC engine 224.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because in some embodiments: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside or connected to a host, as a NAS device, etc. Additionally, the SSD need not be made to emulate a hard drive.

Figure 4:
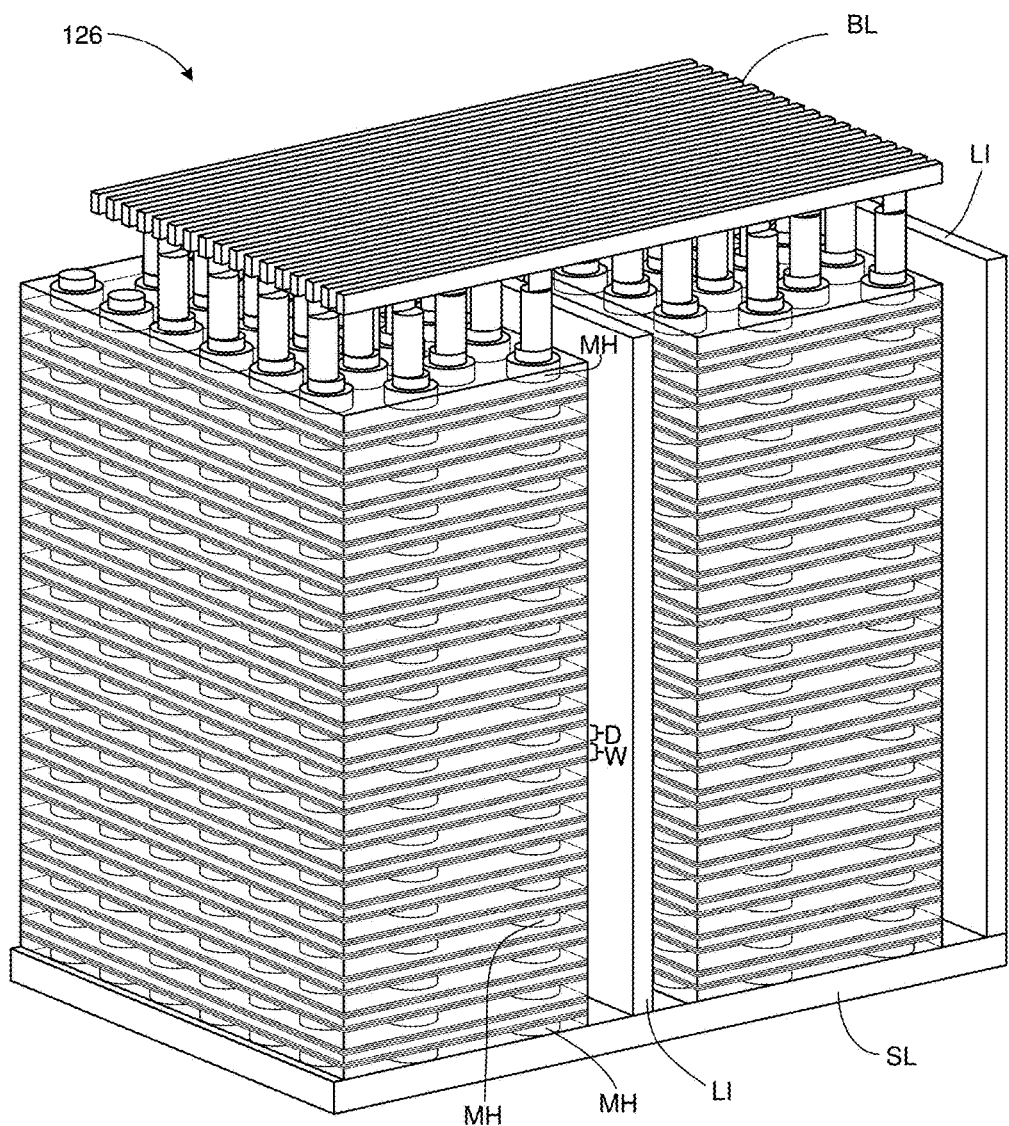
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 are provided below with respect to FIG. 4A-4F.

Figure 4A:
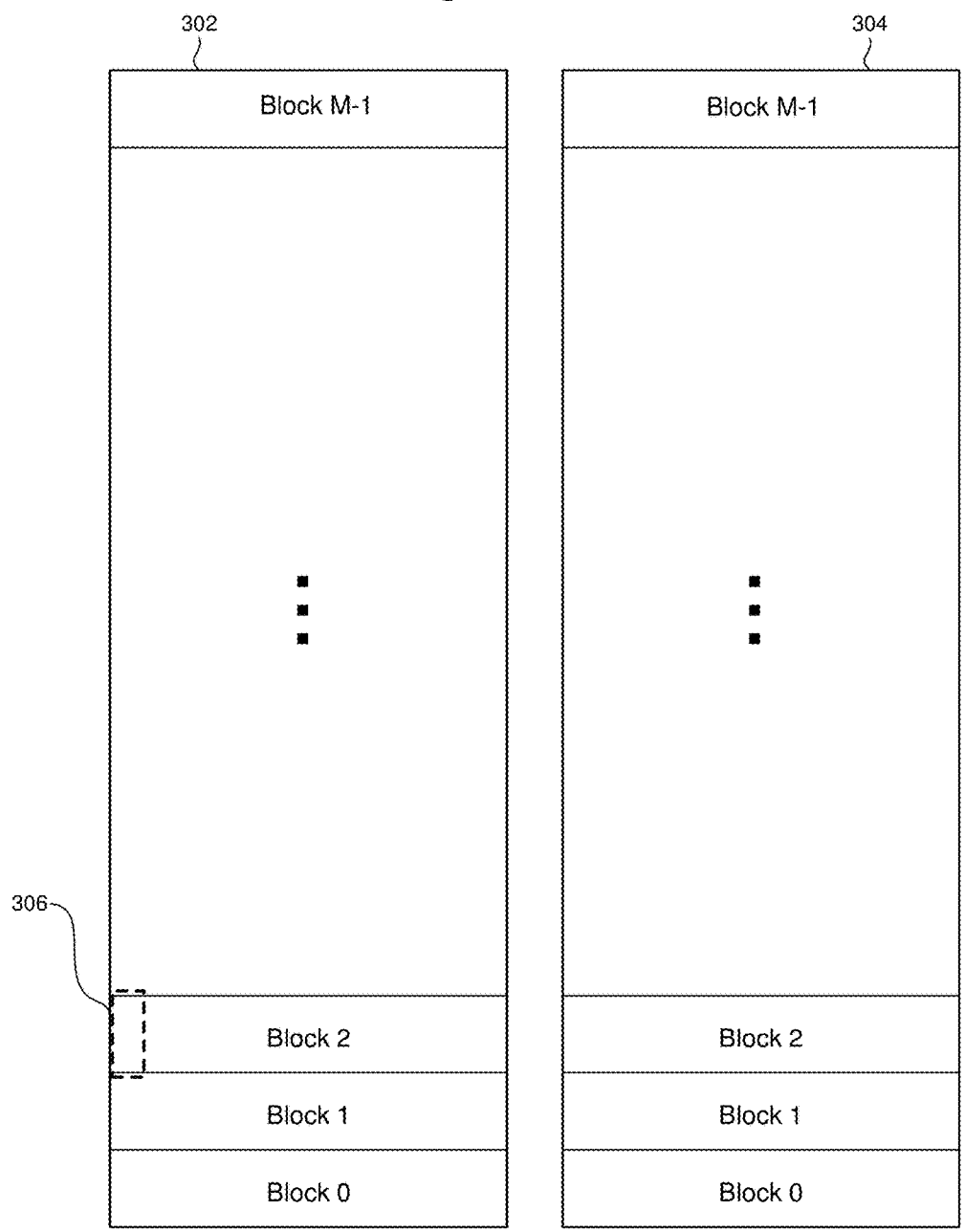
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for one example of two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
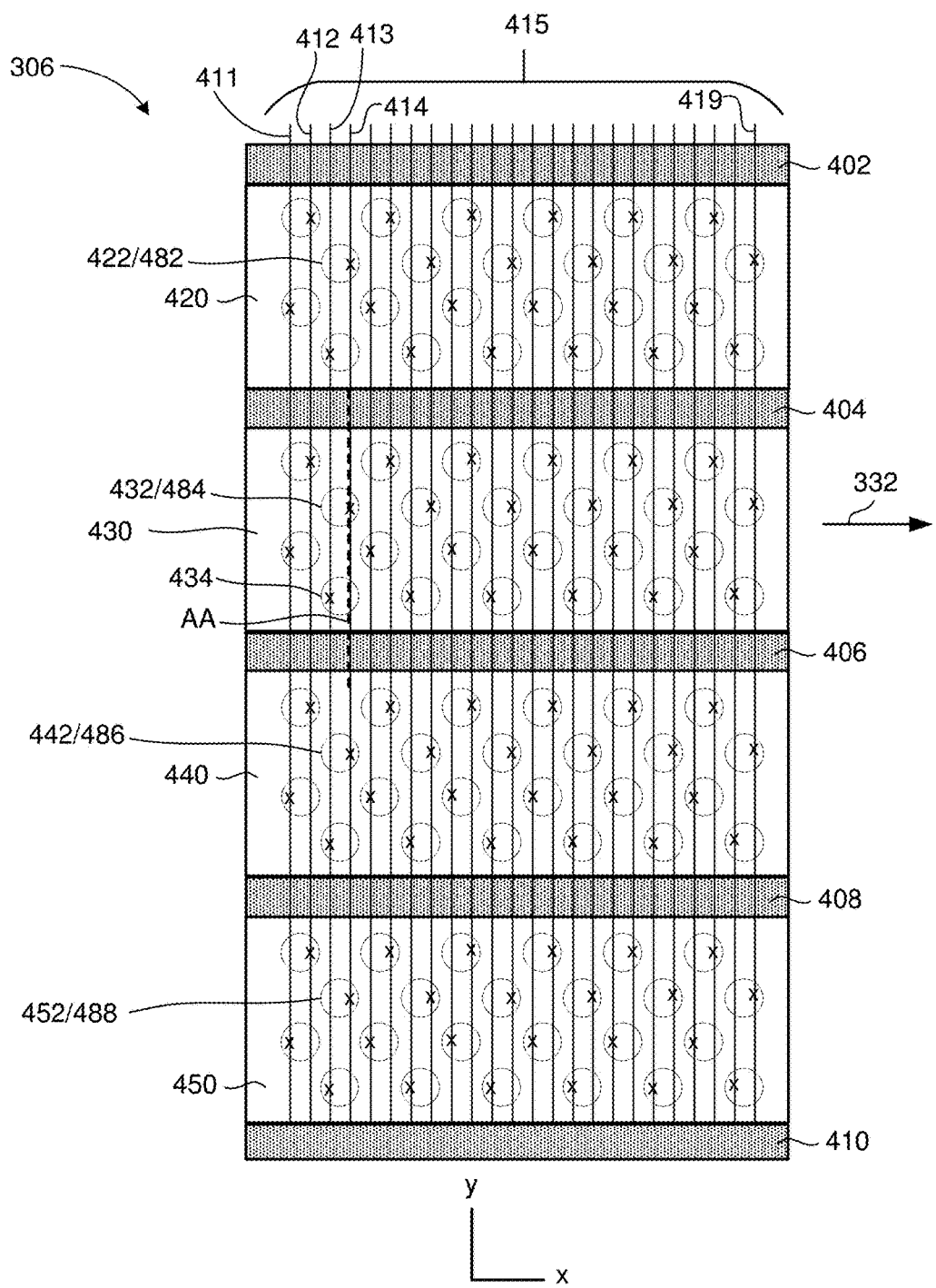
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 332. In one embodiment, the memory array will have 60 layers. Other embodiments have less than or more than 60 layers (e.g., 216 layers). However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines are connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
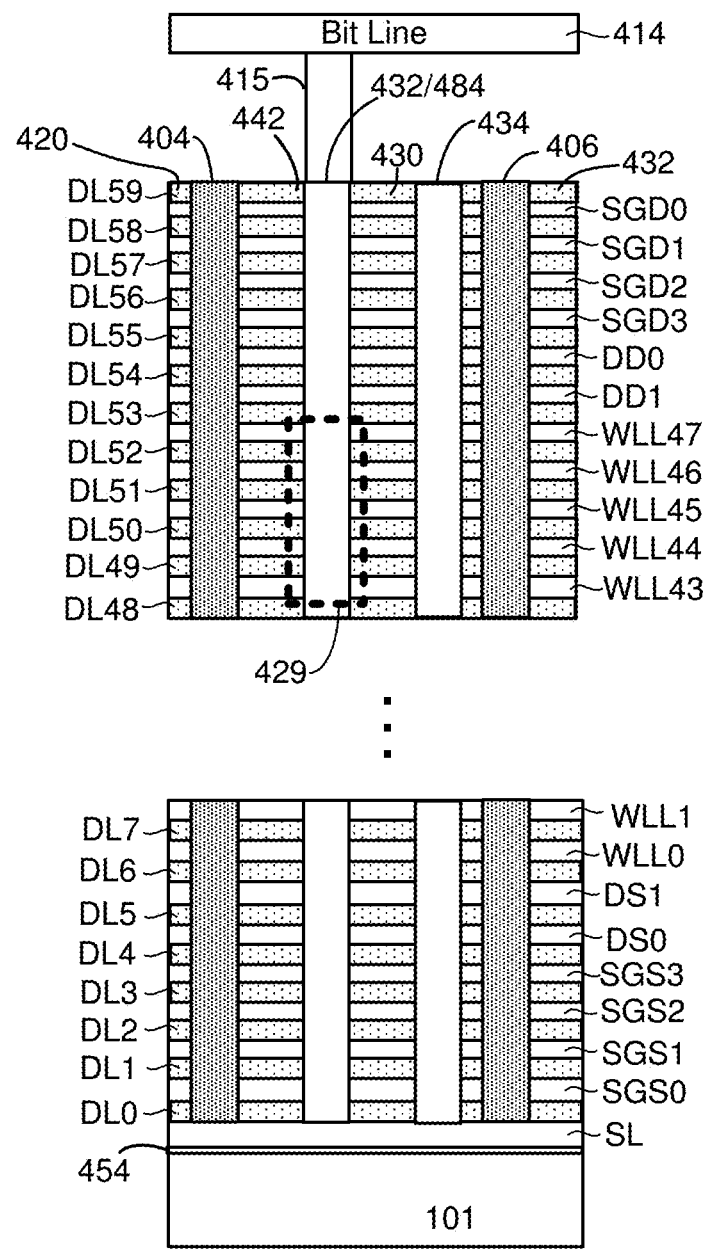
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
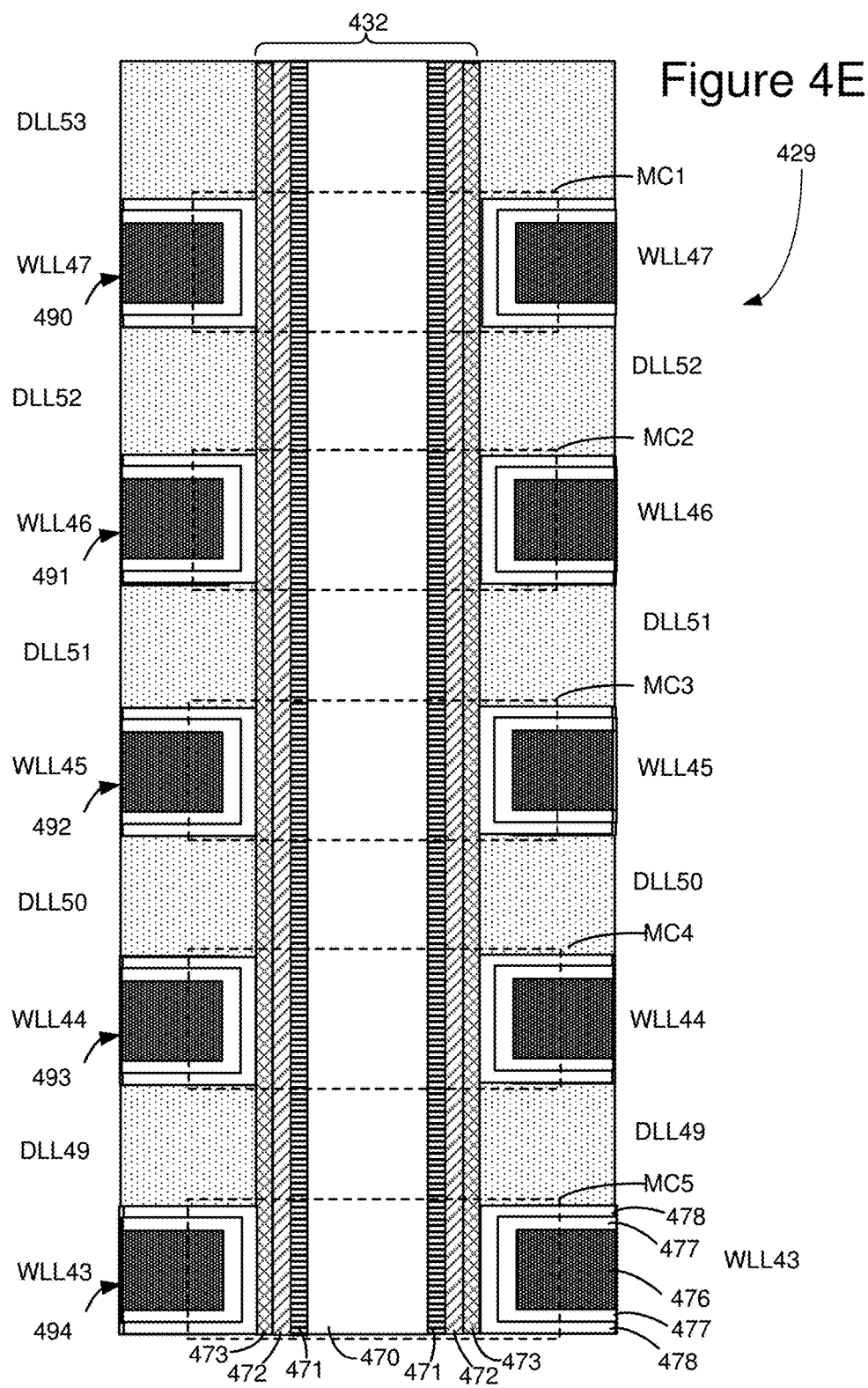
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO$_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
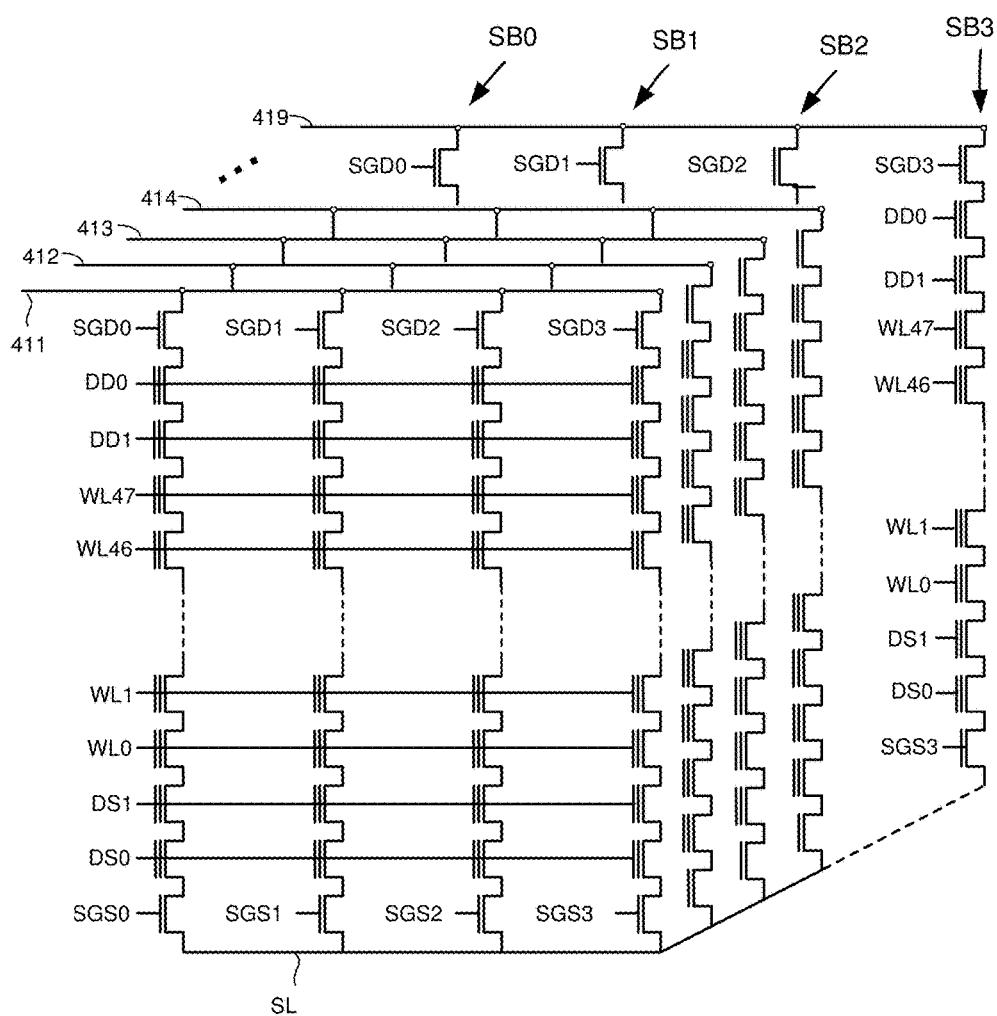
FIG. 4F is a schematic of a plurality of NAND strings.

FIG. 4F shows physical word lines WLL0-WLL47 running across the entire block. The structure of FIG. 4F corresponds to portion 306 in Block 2 of FIG. 4A, including bit lines 411, 412, 413, 414, . . . 419 depicted in FIG. 4B. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a monolithic three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 6:
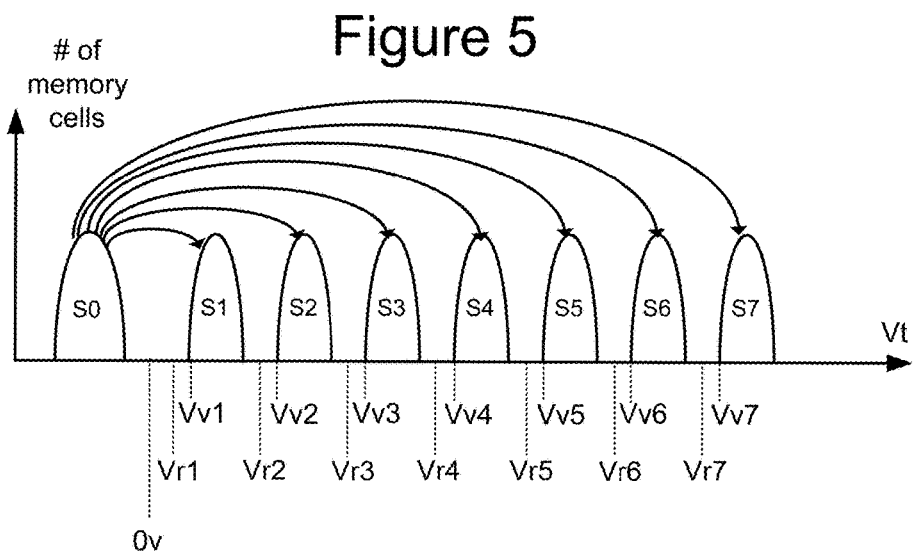
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected. In other embodiments, other data encoding schemes can be used.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming) In some embodiments, data states S1-S7 can overlap, with Controller 122 relying on ECC to identify the correct data being stored.

FIG. 6 is a table describing one example of an assignment of data values to data states. In the table of FIG. 6, S0—111. S1=110, S2=200, S3=000, S4=010, S5=011, S6=001 and S7=101. Other encodings of data can also be used. No particular data encoding is required by the technology disclosed herein. In one embodiment, when a block is subjected to an erase operation, all memory cells are moves to data state S0, the erased state. In the embodiment of FIG. 6, all bits stored in a memory cell are 1 when the memory cells is erased (e.g., in data state S0).

Figure 7A:
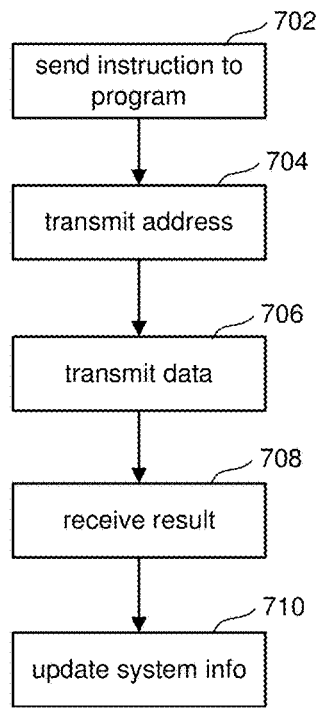
FIG. 7A is a flow chart describing one embodiment of a process for programming.

FIG. 7A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more addresses to one or more memory die 108 that indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive host data and an instruction to program from the host, and the Controller would run the ECC engine 224 to create code words from the host data, as known in the art and described in more detail below. These code words are the data transmitted in step 706. Controller can also scramble the data to achieve wear leveling with respect to the memory cells.

Figure 7B:
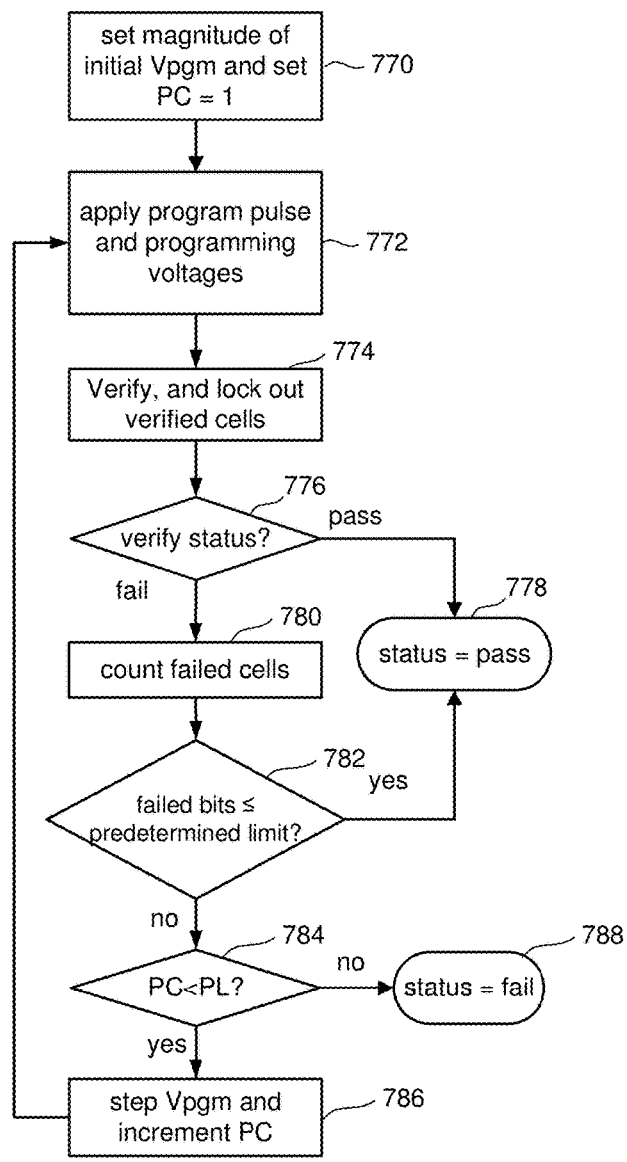
FIG. 7B is a flow chart describing one embodiment of a process for programming.

FIG. 7B is a flowchart describing one embodiment of a process for programming. The process of FIG. 7B is performed by a memory die 108 in response to the steps of FIG. 7A (i.e., in response to the instructions, data and addresses from Controller 122). In one example embodiment, the process of FIG. 7B is performed on memory die 108 using the one or more control circuits discussed above, at the direction of state machine 112. The process of FIG. 7B can be used to implement the full sequence programming discussed above. Additionally, the process of can be used to implement each phase of a multi-phase programming process.

Typically during programming, a program voltage is applied to the control gates (via a selected word line) during a program operation as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming Other voltages can also be used, as per the specific implementation. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage(s).

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits. As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular read parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, Controller 122 receives host data, also referred to as information bits, that is to be stored in memory cells of non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in non-volatile three dimensional memory structure 126 by programming one or more memory cells to one or more data states, which corresponds to v.

When reading data that has been encoded by error correction codes, the code words v read from the memory cells need to be decoded back to the original data i. In one possible implementation, an iterative probabilistic decoding process is used which implements error correction decoding corresponding to the encoding implemented in the Controller 122. Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios (LLRs) which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. The flipping of bits can be thought of as correcting a bit or correcting an error in the data sensed from the memory cells. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

It is hoped that the above-described decoding process results in all parity checks being satisfied, meaning that the decoding process converged on error free data, which is then returned to the host.

It is possible that the code words sensed from the memory cells have too many errors for the ECC process (performed by ECC engine 224) to correct. In that case, the data is deemed uncorrectable and an error message (without the data) is returned to the host.

As mentioned above, there are some applications that do not require 100% error free data. For those applications, if the data is deemed uncorrectable, the host may still want the data. Thus, it is proposed to provide a non-volatile memory system that can return data that includes a limited number of error in response to a request to read data. In some circumstances, the memory system is unable to read the data without any errors; therefore, responding to the read request with some errors is better than responding without any data.

In other circumstances, given enough resources the memory system can provide errorless data; however, it may be more efficient for the system as a whole to conserve resources and return the data with some errors.

FIG. 8 is a flow chart describing one embodiment of method of reading data from a non-volatile memory system that can be configured according to a quality of service indication from a host to provide data in response to a request to read data that includes some limited number of errors. The process of FIG. 8 can be performed by any one or more of the above-described control circuits. In one embodiment, the process of FIG. 8 is performed at the direction of the Controller (on or off the memory die) and/or the state machine (on the memory die).

In step 802 of FIG. 8, the host determines the quality of service needed for the data to be read. While some applications need error free data, other applications can accommodate a small number of errors. In one embodiment, the quality of the service relates to accuracy needed (e.g., an error indication). For example, the host may determine that the application being performed needs 99% accuracy, 98% accuracy, 97% accuracy, etc. Alternatively, the host can require a bit error rate of, for example, 0.5%, 1%, 2%, 4%, etc. Bit error rate (BER) is an indication of the percentage of bits read that have an error. In other embodiments, the quality of service relates to speed or latency. For example, the host may determine that it needs the data back in a certain time period. In another embodiment, the quality of service can be related to the amount of power that can be used to perform the read process. In another embodiment, the host can request the throughput for a series of read commands In step 804 of FIG. 8, the host sends a request to read data to the memory system. That request to read data includes a quality of service indication which indicates the quality of service needed (and determined in step 802). For example, the quality of service indication could indicate a bit error rate of 1%, or a latency of X microseconds.

In step 806, the memory system receives the request to read that includes the quality of service indication. In step 808, the memory system performs a read process that includes sensing the information stored in the memory cells to identify a set of data (code words) with errors. In some circumstances, the data will be read without any errors. In step 810, the memory system determines whether the quality of service as indicated in the quality of service indication received with the request to read in step 804 has been met. For example, has a desired bit error rate been achieved, has a desired latency been achieved, has a desired power limitation been achieved, has the desired timing constraint been achieved, etc. If the desired quality of service has been met (step 810), then in step 812 the memory system return the set of data with the errors in response to the request to read. If the quality of service desired has not been met (step 810), then the memory system returns an error response without returning the set of data. The error response returned in step 814 can include an indication that too many uncorrectable errors have been identified.

FIG. 9 is a flow chart describing one embodiment of a method of reading data from a nonvolatile memory system that can be figured according a quality of service indication from a host to provide data in response to a request to read data that includes some limited number of errors. FIG. 9 provides more details of one example implementation of the process of FIG. 8. In step 902 of FIG. 9, the host determines the quality of service needed for the application being performed. Step 902 is analogous to step 802 in FIG. 8. In step 904, the host sends a request to the memory system to read data. That request to read includes a quality of service indication. Step 904 is analogous to step 804 of FIG. 8.

In step 906 of FIG. 9, Controller 122 for the memory system receives the request to read from the host via the host interface, where that request includes the quality of service indication. In step 908, Controller 122 chooses a read mode based on the quality of service indication. In one embodiment, the memory system will include a number of read modes. Each read mode can specify the ECC read mode to use, as well as other read parameters. An example of other read parameters includes sense time, pre-charge voltages, etc. For example, by lengthening or shortening the sense time, the read process can be sped up but more errors could be encountered. Similarly, using higher voltages may increase the power needed as well as the time to ramp up to those voltages, but that may also reduce the number of errors. There are many parameters involved with error correction processes. The ECC read mode will indicate the strength of the decoding process. A strong decoding process can fix more errors but takes longer. A weaker decoding process fixes less errors but is faster. The memory system can include many ECC read modes so that the host can chose which level of decoding to perform and, as a result, how long that decoding may take. The ECC read mode will be implemented by the ECC engine described above after receiving code words from the memory.

In step 910, Controller 122 sends one or more commands to one or more memory die 108 via the memory interface to perform sensing according to the chosen read mode. For example, a read mode may indicate a sense time or pre-charge voltage that needs to be communicated to the memory die. The read process could include reading data from one memory die or from multiple memory die. In step 912, one or more memory die perform the sensing according to the chosen read mode (e.g., sense time, pre-charge voltages, etc.). Sensing on a memory die is well-known in the art. The result of the sensing of step 912 is a set of code words. In step 914, the code words are transmitted from the one or more memory die to Controller 122 via the memory interface.

In step 916, Controller 122 performs a decoding process for the code words it received from the one or more memory die based on the chosen read mode. For example, this process includes the ECC engine performing error correction according to selected ECC read mode. In some circumstances, all errors from the sensed code words will be corrected and, therefore, the data will have no errors. In other circumstances, the data that results from the decoding process will include one or more errors. Because the decoding is based on code words, in one embodiment Controller 122 knows which code words have uncorrectable errors. When those code words are combined to form bigger chunks of data (e.g., sectors, pages, etc.), Controller 122 will know which portions of the data have an error. In step 918, it is determined whether the number of errors are less than a threshold. If so, then Controller 122 returns the set of data with errors to the host via the host interface in response to the request by the host to read the data (step 920). In one embodiment, the returned set of data from Controller 122 to the host includes an indication of which portions of returned data have an error. In some embodiments, the decoding process can provide an indication of the effort needed to correct the errors. That indication can be provided to the host. Additionally, the bit error rate can be provided to the host so that the host can make decisions about how to use the data. Since the number of errors is less than the threshold, the memory system has concluded that the read process (including the results of the read process) has satisfied the quality of service indication; therefore, Controller 122 is providing the data with errors to the host via the host interface. If the number of errors is not less than the threshold, then Controller 122 determines that the read process did not satisfy the quality of service indication; therefore, Controller 122 returns an error message to the host via the host interface without returning the set of data. The error message will indicate that the data has too many uncorrectable errors.

In one embodiment, the threshold of step 918 is provided as part of the quality of service indication. For example, the quality of service indication can include a bit error rate which is used as a threshold in step 918. In other embodiments, the quality of service indication will include a different operation limitation (e.g., limitation on errors, time or power), and therefore the threshold can be a default threshold used by Controller 122 or a threshold provided by the host.

In one embodiment of steps 916-920, Controller 122 is unable to complete the decoding process to provide error free data. Thus, Controller 122 determines whether the number of remaining errors is less than the threshold. In another embodiment, Controller 122 will stop the decoding process prior to completing the decoding with error free data as soon as the number of errors is less than the threshold. For example, the quality of service indication could indicate a maximum number of errors and Controller 122 will be configured to stop the decoding (stop the read process) when the number of uncorrected errors in the code words (information sensed from the memory cells) satisfies the maximum number of errors. In another embodiment, Controller 122 will perform the decoding process until the time limitation is met and then test whether the number of uncorrected errors is less than the threshold. In another embodiment, Controller 122 will continue performing the decoding process until the power limitation is met and then test the number of uncorrected errors against the threshold. Other permeations can also be performed.

Figure 10:
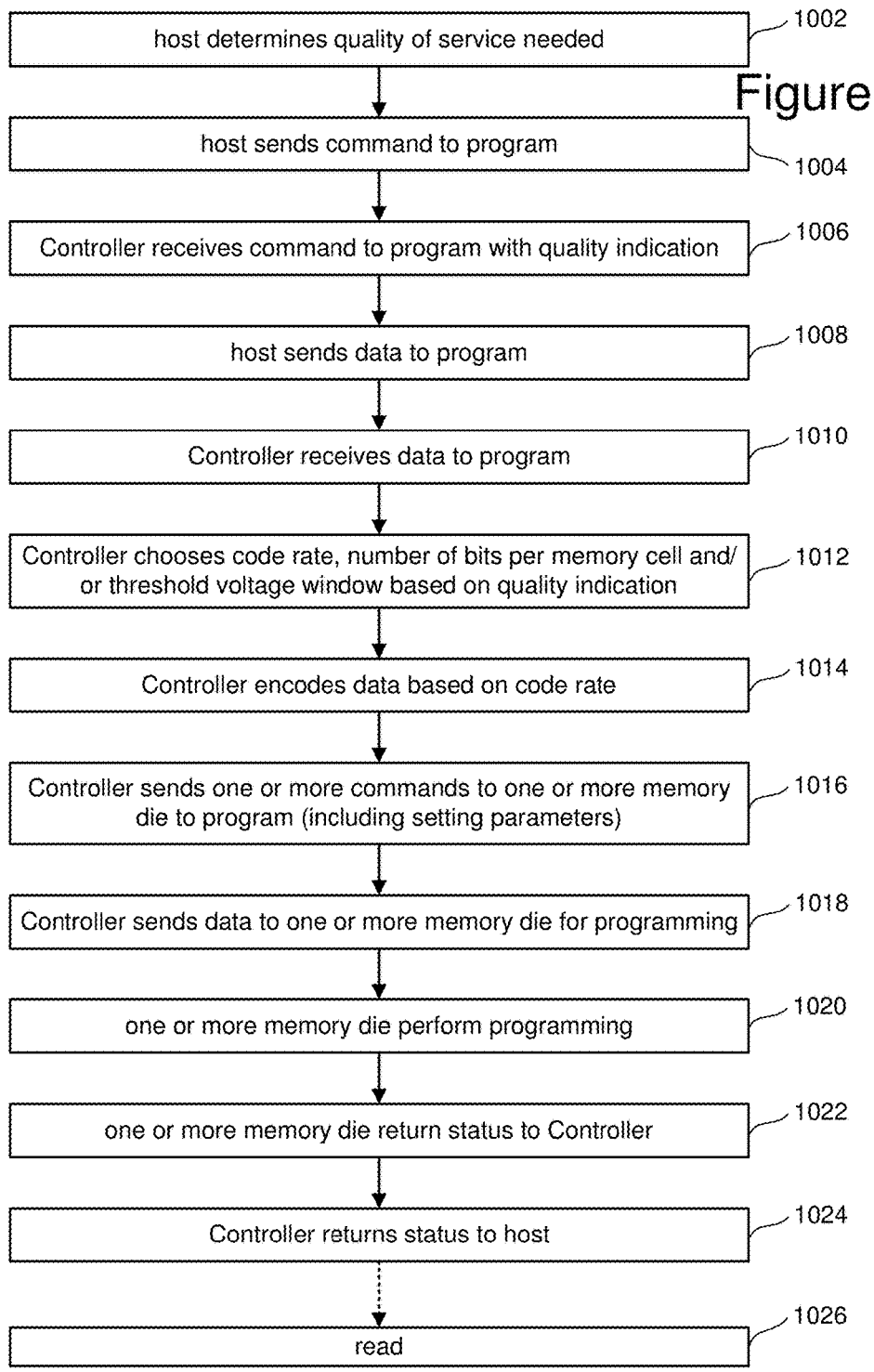
FIG. 10 is a flow chart describing one embodiment of a process for programming data.

Another aspect of the proposed technology can include implementing similar quality of service modes for programming. The host can determine the quality of service of programming that it desires and the memory system choose an appropriate programming and ECC encoding mode (of a plurality of programming and ECC encoding modes) to implement accordingly. FIG. 10 is a flow chart describing one embodiment of a process for programming data that can choose an appropriate programming and ECC encoding mode in response to a quality of service requested from the host.

In step 1002 of FIG. 10, the host determines the quality of service needed for programming the data. In step 1004, the host sends one or more commands to the memory system to program data. In step 1006, Controller 122 receives the command to program via the host interface, with that command including a quality indication. In step 1008, the host sends the data to be programmed to the memory system. In step 1010, Controller 122 receives the data to be programmed. In step 1012, Controller 122 chooses the appropriate programming mode to implement the quality indication. For example, Controller 122 can chose code rate (ratio of data to parity bits), number of bits per memory cell (two bits per memory cell, three bits per memory cell, four bits per memory cell, . . . ) and/or threshold voltage window based on the quality indication. The threshold voltage window is the range of threshold voltages from the bottom of data state S0 to the top of data state S7 (see FIG. 5). In step 1014, Controller 122 encodes the data (using ECC engine 224) based on the chosen code rate. In step 1016, Controller 122 sends the one or more commands via the memory interface to one or more memory die 108 to program the data. This includes sending any parameters or setting any parameters on the memory die 108, including threshold voltage window, number of bits per memory cell, etc. In step 1018, Controller 122 sends the data to one or more memory die for programming, via the memory interface. In step 1010, the one or more memory die perform the programming Note that steps 1016-1020 are performed as described above with respect to FIGS. 5, 6, 7A and 7B. Other programming processes can also be used. In step 1022, the one or more memory die return the status of the programming to Controller 122, via the memory interface. Hopefully, the programming process was successful; therefore, the memory die will return the status of "pass" to Controller 122. In those circumstances where the memory system was unable to properly program the data, the memory die will return the status of "fail" to Controller 122. In step 1024, Controller 122 returns the status received from the memory die to the host, via the host interface. In one embodiment, if the status is "Pass" then Controller 122 will respond to the host that the data was successfully programmed. If the status received by Controller 122 from the memory die 108 was the status of "fail" then, in one embodiment, Controller 122 will attempt to reprogram the data at another location in the memory system.

In step 1026 of FIG. 10, the data programmed will be read. Step 1026 is implemented by using the processes of FIG. 8 and/or FIG. 9. FIG. 10 shows a dotted line between steps 1024 and 1026 to indicate that an indeterminate amount of time can occur between programming the data and reading that same data.

One embodiment includes a non-volatile storage apparatus, comprising a plurality of non-volatile memory cells and one or more control circuits in communication with the memory cells. The one or more control circuits are configured to receive a request to read that includes a quality of service indication and perform a read process for the memory cells that identifies a set of data with errors. The read process satisfies the quality of service indication. The one or more control circuits are configured to return the set of data with errors in response to the request to read.

One embodiment includes a method for operating non-volatile storage, comprising: receiving a request to read that includes an error indication; performing a read process on the non-volatile storage to identify result data that includes a number of errors; and returning the set of data with errors if the number of errors satisfies the error indication.

One embodiment includes an apparatus, comprising: non-volatile semiconductor memory; and means for receiving a request to read that includes an operation limitation, performing a read process on the non-volatile semiconductor memory within the operation limitation and returning data from the read process that includes errors in response to the request to read.

One embodiment includes an apparatus, comprising: a host interface; a memory interface; and one or more processing circuits in communication with the host interface and the memory interface. The one or more processing circuits are configured to receive a request from a host via the host interface to read information stored in a non-volatile memory. The request includes a quality of service indication. The one or more processing circuits are configured to select an ECC read mode based on the quality of service indication. The one or more processing circuits are configured to perform a read process on the non-volatile memory via the memory interface that includes performing error correction according to the selected ECC read mode. The read process identifies a result set of data that includes errors. The one or more processing circuits are configured to return the result set of data that includes errors to the host via the host interface in response to the request to read.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells; and
   one or more control circuits in communication with the memory cells, the one or more control circuits are configured to receive a request to read that includes a quality of service indication specific to the request to read and perform a read process to read data from the memory cells using an error correction decoding process, the one or more control circuits are configured to stop the error correction decoding process prior to completing the error correction decoding process because the quality of service indication is satisfied resulting in error in the data, the one or more control circuits are configured to return the data with errors in response to the request to read.

2. The non-volatile storage apparatus of claim 1, wherein:
   the quality of service indication indicates a number of errors; and
   the returned set of data includes a number of errors that is less than the number of errors.

3. The non-volatile storage apparatus of claim 1, wherein:
   the quality of service indication indicates a timing constraint for responding to the request to read; and
   the one or more control circuits are configured to perform the read process within the timing constraint.

4. The non-volatile storage apparatus of claim 1, wherein:
   the quality of service indication indicates a power limitation for responding to the request to read; and
   the one or more control circuits are configured to perform the read process within the power limitation.

5. The non-volatile storage apparatus of claim 1, wherein:
   the one or more control circuits are configured to choose a read mode based on the quality of service indication; and
   the one or more control circuits are configured to perform the read process according to the chosen read mode.

6. The non-volatile storage apparatus of claim 1, wherein:
   the one or more control circuits are configured to identify one or more portions of the returned data that include the errors.

7. The non-volatile storage apparatus of claim 1, wherein:
   the one or more control circuits are configured to receive a request to program that includes a quality indication; and
   the one or more control circuits are configured to perform programming of the memory cells based on the received quality indication.

8. The non-volatile storage apparatus of claim 7, wherein:
   the one or more control circuits are configured to choose a code rate based on the received quality indication; and
   the one or more control circuits are configured to perform the programming including implementing an error correction encoding process using the chosen code rate.

9. The non-volatile storage apparatus of claim 7, wherein:
   the one or more control circuits are configured to choose a number of bits per memory cell based on the received quality indication; and
   the one or more control circuits are configured to perform the programming into the memory cells at the chosen number of bits per memory cell.

10. The non-volatile storage apparatus of claim 7, wherein:
    the one or more control circuits are configured to choose a threshold voltage window size for the programming based on the received quality indication.

11. The non-volatile storage apparatus of claim 7, wherein:
    the plurality of non-volatile memory cells are arranged in a monolithic three dimensional memory structure;
    the one or more control circuits include a controller and a state machine;
    the controller is on a first die; and
    the state machine and the monolithic three dimensional memory structure are on a second die.

12. A method for operating non-volatile storage, comprising:
    receiving a request to read that includes an error indication;
    performing a read process on the non-volatile storage to read data using an error correction decoding process;
    during the error correction decoding process, determining that the error indication is satisfied;
    stopping the error correction decoding process prior to completing the error correction decoding process because the error indication is satisfied resulting in errors in the data, and
    returning the set of data with errors in response to stopping the error correction decoding process.

13. The method of claim 12, further comprising:
choosing an ECC read mode based on the error indication.

14. The method of claim 12, further comprising:
identifying one or more portions of the returned set of data that includes the errors.

15. The method of claim 12, wherein:
receiving a request to program that includes a quality indication; and
programming the non-volatile storage based on the received quality indication.

16. An apparatus, comprising:
a host interface;
a memory interface; and
one or more processing circuits in communication with the host interface and the memory interface, the one or more processing circuits are configured to receive a request from a host via the host interface to read information stored in a non-volatile memory, the request includes a quality of service indication, the one or more processing circuits are configured to select an ECC read mode that includes an error correction decoding process based on the quality of service indication, the one or more processing circuits are configured to perform a read process on the non-volatile memory via the memory interface that includes performing the error correction decoding process according to the selected ECC read mode, the one or more processing circuits are configured to stop the error correction decoding process prior to completing the error correction decoding process because the quality of service indication is satisfied resulting in error in the result set of data, the one or more processing circuits are configured to return the result set of data that includes errors to the host via the host interface in response to the request to read.

17. The apparatus of claim 16, wherein:
the one or more processing circuits are further configured to return to the host, via the host interface in response to the request to read, an indication of effort needed to correct the errors.

* * * * *